(12) United States Patent
Hainz et al.

(10) Patent No.: US 10,379,530 B2
(45) Date of Patent: Aug. 13, 2019

(54) SIGNAL PROTOCOL FAULT DETECTION SYSTEM AND METHOD

(71) Applicant: Infineon Technologies AG, Neubiberg (DE)

(72) Inventors: Simon Hainz, Villach (AT); Robert Hermann, Voelkermarkt (AT)

(73) Assignee: Infineon Technologies AG, Neubiberg (DE)

( * ) Notice: Subject to any disclaimer, the term of this patent is extended or adjusted under 35 U.S.C. 154(b) by 107 days.

(21) Appl. No.: 15/792,996

(22) Filed: Oct. 25, 2017

(65) Prior Publication Data

US 2018/0129196 A1 May 10, 2018

Related U.S. Application Data

(60) Provisional application No. 62/417,749, filed on Nov. 4, 2016.

(51) Int. Cl.

| G05B 23/02 | (2006.01) |
| G08C 25/02 | (2006.01) |
| G01S 7/28 | (2006.01) |
| H03M 1/00 | (2006.01) |
| G01R 23/00 | (2006.01) |

(52) U.S. Cl.
CPC ............ G05B 23/0275 (2013.01); G01S 7/28 (2013.01); G08C 25/02 (2013.01); H03M 1/001 (2013.01); *G01R 23/005* (2013.01)

(58) Field of Classification Search
CPC ..... G01S 7/00; G01S 7/02; G01S 7/28; G05B 1/00; G05B 23/00; G05B 23/02; G05B 23/0205; G05B 23/0259; G05B 23/0275; G08C 25/00; G08C 25/02; G01R 19/00; G01R 19/16571; G01R 23/00; G01R 23/005; G01R 27/26; G01R 29/26; G01R 31/00; G01R 31/002; G01R 31/08; G01R 31/10; G01R 31/28; H03M 1/001

USPC .... 324/76.11, 76.77, 76.79, 76.82, 500, 512, 324/527, 528, 529, 530, 537, 555, 600, 324/612, 613, 620, 649, 676, 710; 702/1, 702/57, 79, 108, 116, 117, 118, 121, 127, 702/182, 183, 189

See application file for complete search history.

(56) References Cited

U.S. PATENT DOCUMENTS

| 5,020,411 | A | * | 6/1991 | Rowan | F02G 1/043 376/319 |
| 5,375,455 | A | * | 12/1994 | Maresca, Jr. | G01M 3/2892 73/40.5 R |
| 8,412,081 | B2 | * | 4/2013 | Kudo | G03G 15/161 198/810.03 |
| 9,057,761 | B2 | * | 6/2015 | Whatmough | G01R 31/30 |
| 2017/0153760 | A1 | * | 6/2017 | Chawda | G06F 3/0418 |
| 2018/0074170 | A1 | * | 3/2018 | Ray | G01S 7/2923 |

* cited by examiner

*Primary Examiner* — Hoai-An D. Nguyen
(74) *Attorney, Agent, or Firm* — Schiff Hardin LLP

(57) ABSTRACT

In systems, such as sensor systems, an output signal of the system (e.g. output of the sensor corresponding to a sensed characteristic) can be generated and provided. In response to a detected error, the output signal can be adjusted to generate an error indication signal pulse to indicate that an error has been detected. The output signal can then be adjusted to return to a signal level corresponding to the sensed characteristic. In response to the error being resolved, an error resolution signal pulse can be generated.

20 Claims, 10 Drawing Sheets

SIGNAL PROTOCOL FAULT DETECTION SYSTEM AND METHOD

CROSS REFERENCE TO RELATED APPLICATIONS

This patent application claims the benefit of U.S. Provisional Patent Application No. 62/417,749, filed Nov. 4, 2016, entitled "PWM PROTOCOL WITH 3RD CURRENT LEVEL FOR STANDSTILL AND SAFETY," which is incorporated herein by reference in its entirety.

BACKGROUND

Field

Embodiments described herein generally relate to signal processing and fault detection systems and methods, including fault detection signaling systems and methods in sensor systems.

Related Art

During operation, sensing systems having one or more sensors may improperly operate. For example, the sensor(s) may incur one or more faults or otherwise fail to operate properly. A control unit, such as a controller, may be unaware of the operational status of the sensor(s), which may comprise the overall operation of the system.

BRIEF DESCRIPTION OF THE DRAWINGS/FIGURES

The accompanying drawings, which are incorporated herein and form a part of the specification, illustrate the embodiments of the present disclosure and, together with the description, further serve to explain the principles of the embodiments and to enable a person skilled in the pertinent art to make and use the embodiments.

The exemplary embodiments of the present disclosure will be described with reference to the accompanying drawings. The drawing in which an element first appears is typically indicated by the leftmost digit(s) in the corresponding reference number.

DETAILED DESCRIPTION

Figure 1:
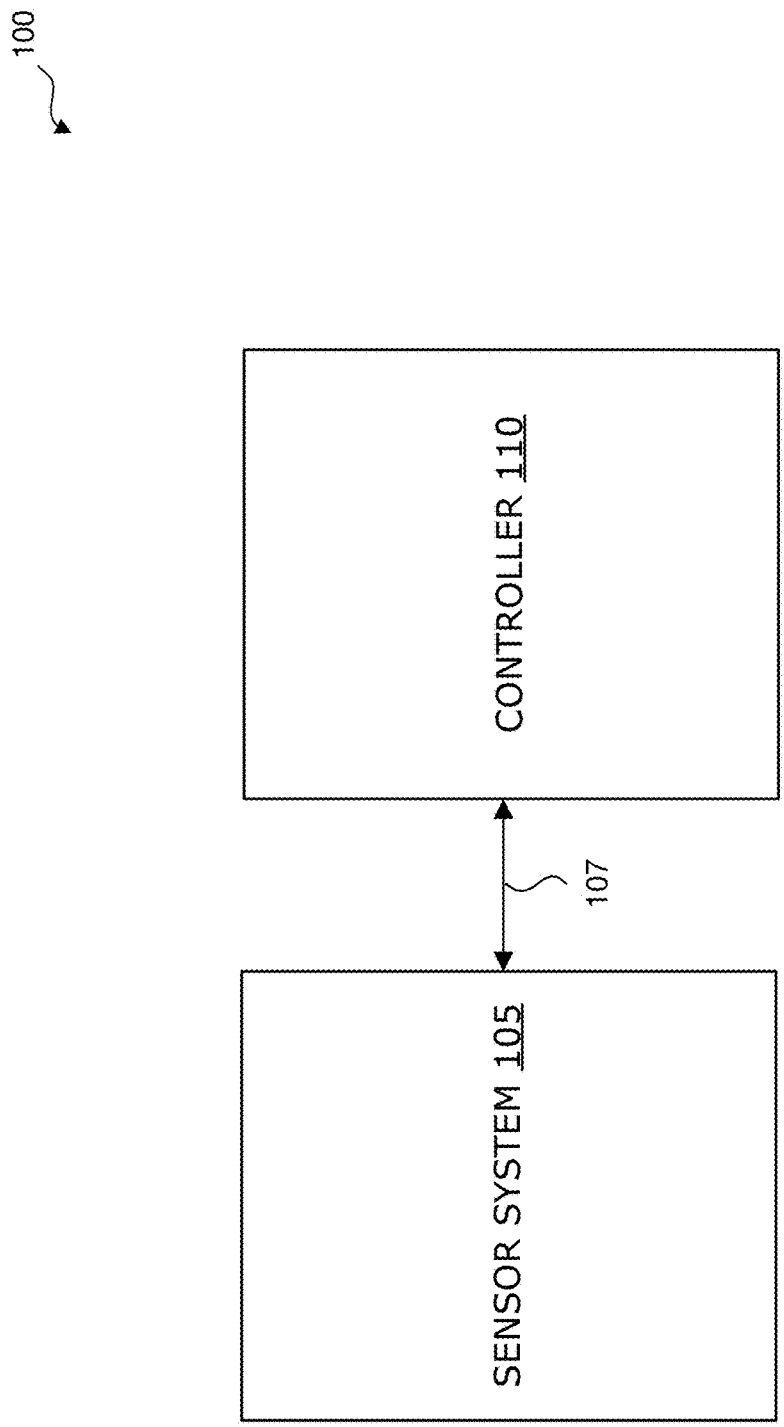
FIG. 1 illustrates a sensor environment according to an exemplary embodiment of the present disclosure.

In the following description, numerous specific details are set forth in order to provide a thorough understanding of the embodiments of the present disclosure. However, it will be apparent to those skilled in the art that the embodiments, including structures, systems, and methods, may be practiced without these specific details. The description and representation herein are the common means used by those experienced or skilled in the art to most effectively convey the substance of their work to others skilled in the art. In other instances, well-known methods, procedures, components, and circuitry have not been described in detail to avoid unnecessarily obscuring embodiments of the disclosure.

Embodiments are described with reference to sensing systems having one or more sensors (e.g. magnetoresistive sensors configured to measure, for example, rotational speed and/or direction of a rotating object). The systems can be configured to perform one or more signal processing operations and/or use signal protocol(s) for operational status detection and notification. For example, one or more sensors can be configured to provide its operational status using one or more signaling protocols to one or more devices (e.g. controllers, transmission controller, etc.). However, the present disclosure is not limited to the type of sensors in the sensing systems, or to the particular sensing systems. Embodiments can be implemented in other types of systems, where component(s) of the system can utilize one or more signal protocols according to embodiments described herein for operational status detection and component notifications (including error/fault detection and notifications).

As an overview, embodiments relate to methods and sensor systems configured to perform one or more self-diagnostic operations to, for example, detect one or more internal faults or errors. With functional safety, self-diagnostic operations improve the operation of the systems and improve the accuracy of sensor output signals and processing of such signals by a controller, (e.g. signal processor, transmission controller, etc.). These and other embodiments also provide additional benefits and advantages as discussed herein.

In one or more exemplary embodiments, one or more sensors can be configured to sense one or more physical characteristics and generate an output signal corresponding to the detected characteristic(s). The output signal can be generated at a particular signal level, such as at a particular voltage and/or current level. For example, the sensor can include one or more current sources that are configured to generate the output signal at one or more current levels. In an exemplary embodiment, the amplitude (e.g. current level) of the output signal can alternate between first and second amplitude values. The output signal can be periodic or non-periodic. For example, the output signal can alternate between a signal level of 7 mA and 14 mA, but is not limited to these exemplary values. The signal level can have other amplitudes as would be understood by one of ordinary skill in the relevant arts.

Upon the detection of an internal fault or error, the sensor can be configured generate an output signal at a third signal level (amplitude) that is different from the signal levels (e.g. 7 mA and 14 mA) used to reflect the sensed physical characteristic. In an exemplary embodiment, the third signal level can have an amplitude of, for example, 3 mA, but is not limited thereto. In this example, the sensor is configured to generate the output signal that transitions between 7 mA and 14 mA to reflect the sensed physical characteristic and at an amplitude of 3 mA for internal error processing (e.g. error detection notification, error resolution notification). For example, the output signal at 3 mA can be used to indicate that an internal fault or error has been detected (e.g. by the sensor), and/or that the internal faults or error has been resolved. The present disclosure is not limited to these signal levels and these exemplary amplitudes (e.g., 3, 7, 14 mA) and exemplary embodiments can include amplitudes having values such as 7 mA, 14 mA, and 28 mA, or other amplitude values as would be understood by one of ordinary skill in the relevant arts. In embodiments where the sensor is configured for amplitudes of 7 mA, 14 mA, and 28 mA, the sensor can be configured to output the output signal having an amplitude that transitions between, for example, 14 mA and 28 mA to reflect the sensed physical characteristic and to output the output signal at an amplitude of 7 mA for error detection processing (e.g. as a notification for a detected error).

In operation, when the sensor detects an internal fault or error, the sensor can enter what is referred to as a "safe state." In a safe state, the sensor can be configured to adjust the amplitude of the output signal from a sensing signal level (e.g., 7 mA and 14 mA) to an error signal level (e.g., 3 mA). In an exemplary embodiment, the sensor can generate a signal pulse at an error signal level to generate an error indication signal pulse and/or an error resolution signal pulse. The pulse width of the error indication signal pulse and of the error resolution signal pulse can be different or the same. In operation, the error indication signal pulse provides an indication that an error has been detected (e.g. by the sensor). Similarly, an error resolution signal pulse provides an indication that the detected error has been resolved, mitigated, or the impact of such error has otherwise been reduced.

In an exemplary embodiment, the pulse width of a corresponding single pulse can be fixed or variable. For example, the pulse width of an error indication signal pulse can depend on the particular type of error that has been detected. In this example, the pulse width of the error indication signal can indicate the type of error that has been detected. Similarly, the pulse width of an error resolution signal pulse can depend on an identified cause of the detected error, and/or the degree at which the error has been resolved. For example, the pulse width of the error resolution signal pulse can reflect particular causes of the detected error, and/or reflect if the error was partially or completely resolved. In one or more embodiments, the pulse width of the error indication signal pulse can additionally or alternatively be used as an indicator of a detected cause of the error.

In an exemplary embodiment, the sensor is configured to adjust the signal level following the error indication signal pulse to return the output signal to the sensing signal level (e.g., 7 mA and 14 mA). In this example, the sensor is configured to provide to the output signal corresponding to the sensed physical characteristic following a detected error but before the error has been resolved. That is, the sensor is configured to output the output signal corresponding to the sense characteristic during the time period between error detection and error resolution (i.e. during a safe state or error state operation of the sensor). In this example, the sensor can continue to advantageously provide the output signal corresponding to the sensed physical characteristic even after an error has been detected rather than, for example, maintaining the output signal at the error signal level amplitude until the error has been resolved. Therefore, a controller or other device utilizing the output signal can continue to receive information regarding the sensed physical characteristic during an error (safe) operation state. Although this output signal may be compromised due to the detected error, the controller or other device receiving and/or processing the output signal can take this possibility into consideration given a previous receipt of the error indication signal pulse.

Embodiments thereby can provide improved error detection and notification while also improving the time period in which sensed characteristic information is provided by the sensor (i.e., embodiments can reduce downtime in which the sensor does not provide an output signal corresponding to a sensed physical characteristic during an error state). These and other embodiments also provide additional benefits and advantages as discussed herein.

FIG. 1 illustrates a sensor environment 100 according to an exemplary embodiment of the present disclosure. In an exemplary embodiment, the sensor environment 100 includes a sensor system 105 coupled to a controller 110 via a communication path 107. The communication path 107 can communicatively and/or electrically couple the sensor system 105 and the controller 110 together. In operation, the sensor system 105 can be configured to sense one or more physical characteristics and generate and output signal corresponding to the sensed physical characteristic. The sensor system 105 can provide the output signal to the controller 110 via the communication path 107. In an exemplary embodiment, the output signal can be generated at a particular signal level, such as a particular voltage and/or current level. For example, the sensor system 105 can include one or more current and/or voltage sources that are configured to generate the output signal at one or more current and/or voltage levels. In an exemplary embodiment, the amplitude (e.g. current level) of the output signal can alternate between first and second amplitude values, which can be referred to as sensing signal levels. The output signal can be periodic or non-periodic. For example, the output signal can alternate between a signal level of 7 mA and 14 mA, but is not limited to these exemplary values. The signal level can have other amplitudes as would be understood by one of ordinary skill in the relevant arts.

Upon the detection of an internal fault or error, the sensor system 105 can be configured generate an output signal at a third signal level (amplitude) that is different from the sensing signal levels (e.g. 7 mA and 14 mA) used to reflect the sensed physical characteristic. In an exemplary embodiment, the third signal level (i.e. error signal level) can have an amplitude of, for example, 3 mA. In this example, the sensor system 105 is configured to generate the output signal at the sensing signal level that transitions between, for example, 7 mA and 14 mA to reflect the sensed physical characteristic, or at the error signal level (e.g. amplitude of 3 mA) for internal error processing (e.g. error detection notification, error resolution notification). For example, the output signal at the error signal level can be used to indicate that an internal fault or error has been detected, and/or that the internal fault or error has been resolved. The present disclosure is not limited to these signal levels and these exemplary amplitudes (e.g., 3, 7, 14 mA), and exemplary embodiments can include amplitudes having other values such as, for example, 7 mA, 14 mA, and 28 mA, or other amplitude values as would be understood by one of ordinary skill in the relevant arts. In embodiments where the sensor is configured for amplitudes of 7 mA, 14 mA, and 28 mA, the sensor system 105 can be configured to output the output signal having an amplitude that transitions between 14 mA and 28 mA to reflect the sensed physical characteristic and to output the output signal at an amplitude of 7 mA for error detection processing.

In operation, when the sensor system 105 detects an internal fault or error, the sensor system 105 can enter a safe state. In the safe state, the sensor system 105 can be configured to adjust the amplitude of the output signal from a sensing signal level (e.g., 7 mA and 14 mA) to an error signal level (e.g., 3 mA). In an exemplary embodiment, the sensor system 105 can generate a signal pulse at the error signal level to generate an error indication signal pulse and/or an error resolution signal pulse. The pulse width of the error indication signal pulse and of the error resolution signal pulse can be different or the same. In operation, the error indication signal pulse provides an indication that an error has been detected by the sensor system 105. Similarly, an error resolution signal pulse provides an indication that the detected error has been resolved or mitigated, or that the impact of such error has otherwise been reduced.

In an exemplary embodiment, the pulse width of a corresponding single pulse can be fixed or variable. For example, the pulse width of an error indication signal pulse can depend on, for example, the particular type of error that has been detected by the sensor system 105. In this example, the pulse width of the error indication signal can indicate the type of error that has been detected. Similarly, the pulse width of an error resolution signal pulse can depend on an identified cause of the detected error, and/or the degree at which the error has been resolved. For example, the pulse width of the error resolution signal pulse can reflect particular causes of the detected error, and/or reflect if the error was partially or completely resolved. In one or more embodiments, the pulse width of the error indication signal pulse can additionally or alternatively be used as an indicator of a detected cause of the error. In other embodiments, the error resolution signal pulse can be configured with a pulse width to indicate that an impact of the detected error has increased, decreased, or remains the same.

In an exemplary embodiment, the sensor system 105 is configured to adjust the signal level following the error indication signal pulse to return the output signal to the sensing signal level (e.g., 7 mA and 14 mA). In this example, the sensor system 105 is configured to provide to the output signal corresponding to the sensed physical characteristic following a detected error but before the error has been resolved. That is, the sensor system 105 is configured to output the output signal corresponding to the sensed characteristic during the time period between error detection and error resolution (i.e. during the safe state/error state operation of the sensor system 105). In this example, the sensor system 105 can continue to advantageously provide the output signal corresponding to the sensed physical characteristic even after an error has been detected rather than, for example, maintaining the output signal at the error signal level amplitude until the error has been resolved. Therefore, the controller 110 (and/or other device utilizing the output signal) can continue to receive information regarding the sensed physical characteristic during an error operation (safe) state. Although this output signal may be compromised due to the detected error, the controller 110 (or other device) processing the output signal can take the potential compromised state of the signal into consideration because the controller 110 was notified earlier based on the receipt of the error indication signal pulse.

The controller 110 can be configured to perform one or more signal processing operations on the output signal, control the overall operation of the sensor environment 100, including controlling the operation of the sensor system 105, and/or provide the received output signal, and/or a processed output signal (i.e. the output signal that has been processed by the controller 110) to one or more other components of the sensor environment 100 and/or one or more components of a system or device implementing the sensor environment 100. In an exemplary embodiment, the controller 110 is a transmission controller of a transmission system, but is not limited thereto. In this example, the sensor system 105 is configured to sense rotational speed and/or a rotational direction of a rotating object (e.g., camshaft) of the transition system.

In an exemplary embodiment, the sensor system 105 is a magnetoresistive sensing system that includes one or more magnetoresistive sensors configured to sense rotational speed and/or direction of a rotating object (e.g., rotating tooth or pole wheel). The magnetoresistive sensors can include one or more magnetic field sensors associated with, for example, a rotating tooth or pole wheel and a back biased magnet, where the magnetic field sensors are configured to sense rotation and/or position of, for example, a rotating object (e.g., camshaft that includes a tooth or pole wheel). The present disclosure is not limited to the type of sensors in the sensing system, or to the particular sensing systems. Further, the sensor system 105 can include one or more other sensors that are configured to sense one or more other physical characteristics (e.g., temperature, field amplitude, etc.).

Figure 2A:
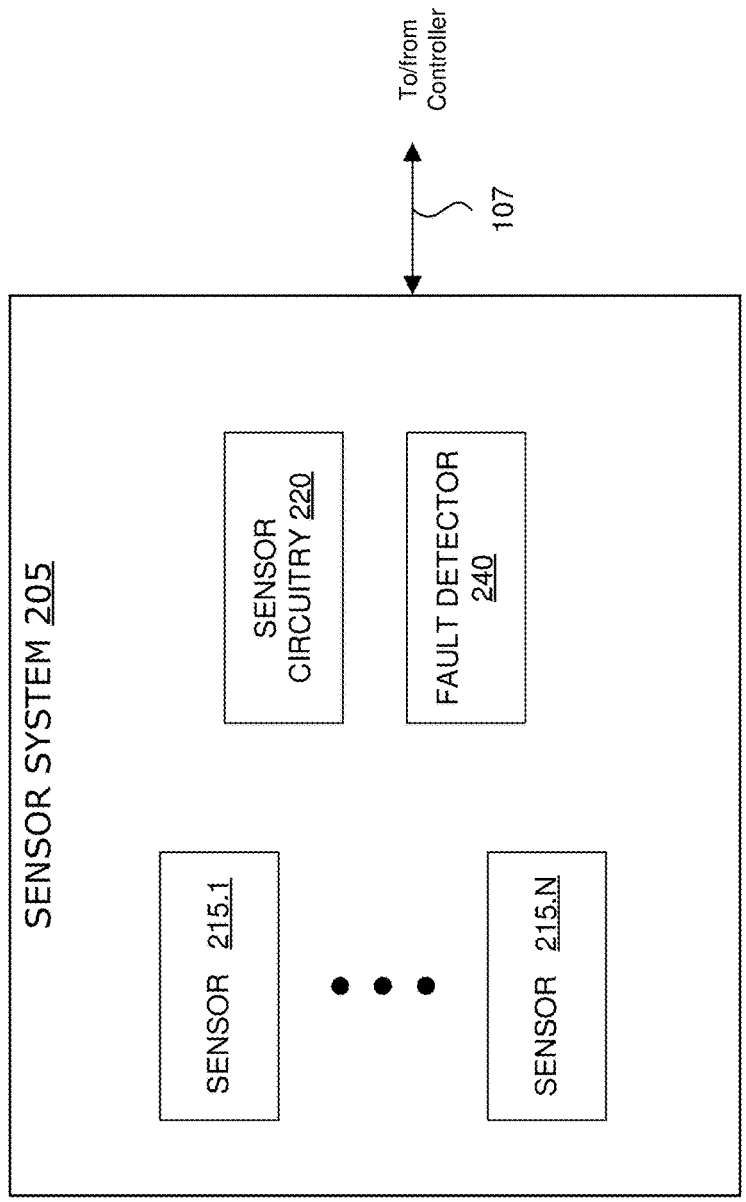
FIG. 2A illustrates a sensor system according to an exemplary embodiment of the present disclosure.
Figure 2B:
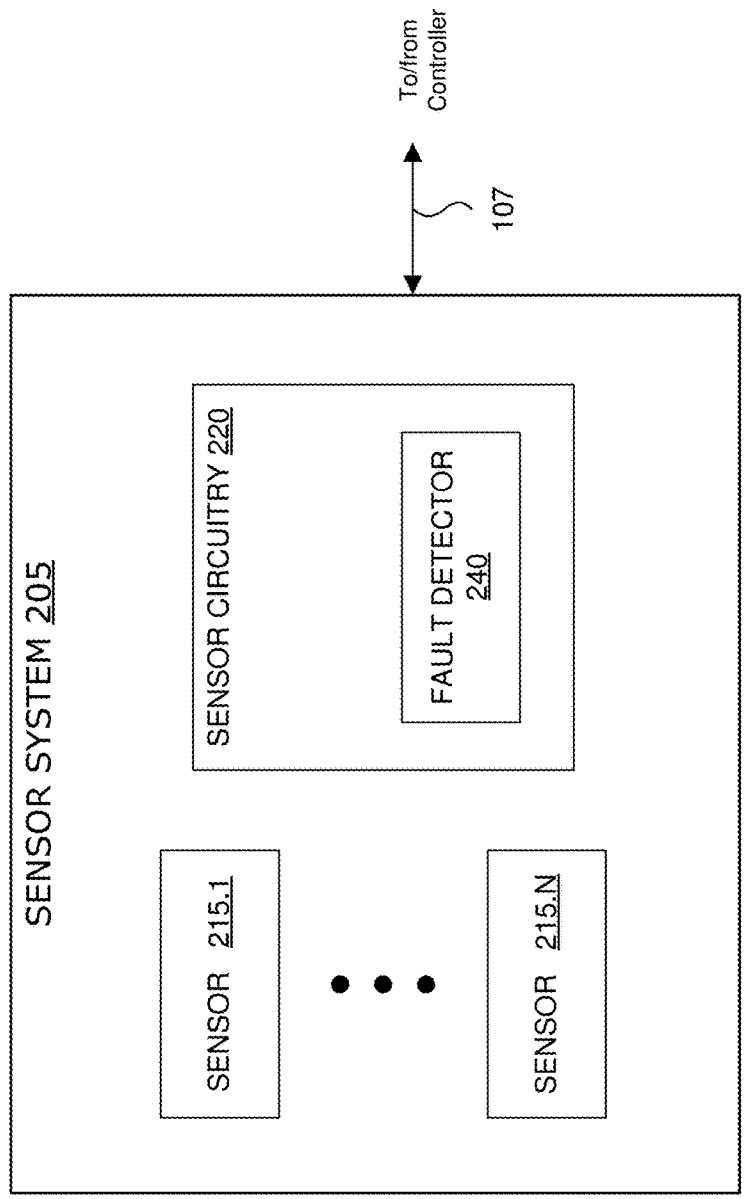
FIG. 2B illustrates a sensor system according to an exemplary embodiment of the present disclosure.

FIG. 2A illustrates a sensor system 205 according to an exemplary embodiment of the present disclosure. The sensor system 205 is an embodiment of the sensor system 105 of FIG. 1. FIG. 2B illustrates an alternative embodiment of the sensor system 205 in which the fault detector 240 is embodied in the sensor circuitry 220.

In an exemplary embodiment, the sensor system 205 includes one or more sensors 215.1 to 215.N, sensor circuity 220, and a fault detector 240. The sensors 215.1 to 215.N can be configured to sense one or more physical characteristics and to provide sensing information corresponding to the sensed physical characteristics to the sensor circuitry 220. In an exemplary embodiment, sensors 215.1 to 215.N include processor circuitry configured to perform one or more operations and/or functions of the corresponding sensor 215, including, for example, sensing one or more physical characteristics and generating and providing corresponding sensing information.

In an exemplary embodiment, one or more of the sensors 215 are magnetoresistive sensors configured to sense rotational speed and/or direction of a rotating object (e.g., rotating tooth or pole wheel). The magnetoresistive sensors can include one or more magnetic field sensors associated with, for example, a rotating tooth or pole wheel and a back biased magnet, where the magnetic field sensors are configured to sense rotation and/or position of, for example, a rotating object (e.g., camshaft that includes a tooth or pole wheel). The magnetic field sensor can be, for example, a Hall-effect sensor but are not limited thereto. The sensor(s) 215 (including the magnet field sensors) can be other sensor types as would be understood by one of ordinary skill in the relevant arts.

In an exemplary embodiment, the sensor(s) 215 can be configured to sense or otherwise detect a varying magnetic field caused by, for example, a rotating target wheel, and generate a magnetic field signal (e.g., signals 305-705 in FIGS. 3-7, respectively) based on a sensed magnetic field. As illustrated in, for example, FIGS. 3-7, the signals 305-705 can include peaks (e.g. 307) and valleys (e.g. 309) corresponding to the teeth and valleys of the target wheel. The output signal can indicate the strength and phase of the magnetic field during rotation.

The present disclosure is not limited to the type of sensors 215 in the sensing system, or to the particular sensing systems. Further, the sensor system 105 can include one or more other sensors that are configured to sense one or more other physical characteristics (e.g., temperature, field amplitude, etc.).

In an exemplary embodiment, the sensor circuitry 220 is configured to perform one or more signal processing operations on the sensing information received from one or more of the sensors 215 to generate the output signal of the sensor system 205, which can be provided to the controller 110 via the communication path 107. For example, the sensor circuitry 220 can be configured to perform one or more signal processing operations on a magnetic field signal received from one or more magnetoresistive sensors 215, and to generate the output signal based on the received magnetic field signals.

In an exemplary embodiment, the sensor circuitry 220 includes processor circuitry configured to process the received sensing information (e.g., magnetic field signal) from the sensor(s) 215 and generate output signal (e.g., 305) based on the processed sensing information. The processor circuitry can be configured to control the overall operation of the sensor system 205, such as the operation of the sensor circuitry 220, the sensor(s) 215, and/or the fault detector 240. The processor circuitry can be configured to run one or more applications, operating systems, power management functions (e.g., battery control and monitoring), and/or other operations as would be understood by one of ordinary skill in the relevant arts.

The sensor circuitry 220 can also include a memory that stores data and/or instructions, where when the instructions are executed by the processor circuitry, controls the processor circuitry to perform the functions described herein. The memory can store, for example, sensing information, processed sensing information, one or more detected internal faults or errors, information associated with one or more detected internal faults or errors, one or more causes of one or more corresponding faults or errors, or any other information as would be understood by one of ordinary skill in the relevant arts. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

In an exemplary embodiment, the sensor circuitry 220 can additionally or alternatively include sensor logic, one or more comparators, one or more analog-to-digital converters (ADC), one or more digital-to-analog converters (DAC), one or more processors, including one or more signal processors, or other circuitry, logic, and/or code as would be understood by one of ordinary skill in the relevant arts.

In an exemplary embodiment, the sensor circuitry 220 can additionally or alternatively include one or more signal generators that are configured to generate the output signal. The signal generators can generate the output signal based on the sensing information received from one or more the sensors 215. In an exemplary embodiment, the signal generator(s) can include one or more current sources configured to generate the output signal at one or more current levels. For example, the sensor circuitry 220 can include a first current source configured to generate the output signal at 14 mA, a second current source configured to generate the output signal at 7 mA, and a third current source configured to generate the output signal at 3 mA. In other embodiments, the sensor circuitry 220 can include one or more current sources that are configured to generate the output signal at multiple current levels and selectively switch between the various current levels. The signal generators are not limited to current sources and can additionally or alternatively include other types of sources, such as one or more voltage sources configured to generate the output signal having one or more voltages, or other types of sources as would be understood by one of ordinary skill in the relevant arts.

The fault detector 240 can be configured to detect one or more internal faults and/or errors of the sensor system 205, including one or more faults or errors of one or more of the sensors 215, the sensor circuitry 220, the fault detector 240 itself, and/or one or more other components of the sensor system 205. The fault detector 240 can notify the sensor circuitry 220 of the detected error.

Figure 3:
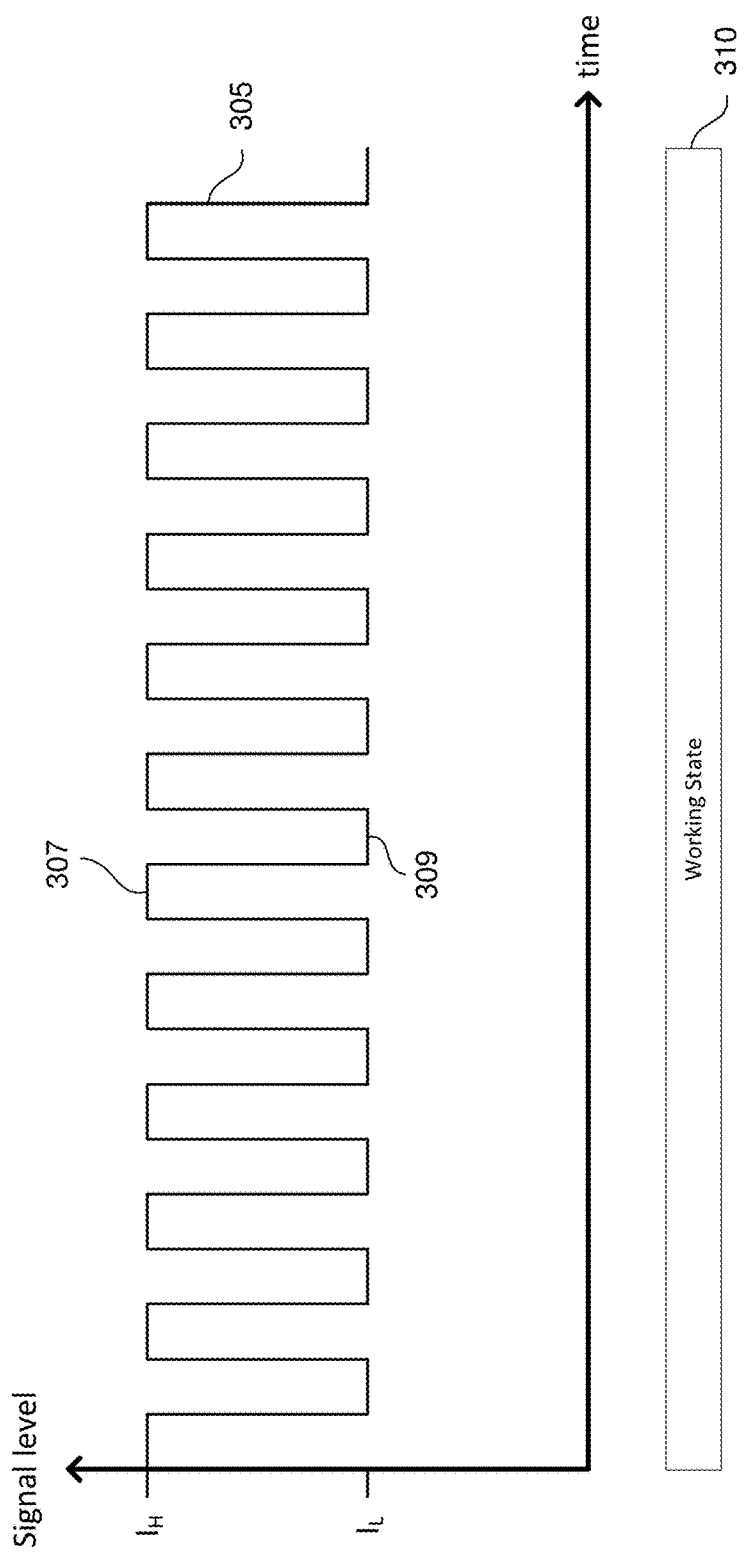
FIG. 3 illustrates a plot of a sensor output according to an exemplary embodiment of the present disclosure.

Turning to FIG. 3, the output signal 305 of the sensor system 205 according to an exemplary embodiment is illustrated. In particular, FIG. 3 shows a plot of a signal level (vertical axis) of the output signal 305 versus time (horizontal axis). The output signal 305 corresponds to the output signal having a sensing signal level and during normal operation (i.e. working state) of the sensor system 205. That is, the output signal 305 of FIG. 3 corresponds to an output signal of the sensor system 205 that is operating without an internal fault or error. As shown in FIG. 3, the output signal 305 has peaks 307 and valleys 309 as the output signal 305 transitions between a high signal level ($I_H$) and a low signal level ($I_L$). In an exemplary embodiment, the high signal level ($I_H$) can correspond to a current level of, for example, 14 mA, and the low signal level ($I_L$) can correspond to a current level of, for example, 7 mA, but are not limited thereto. In this example, the output signal 305 corresponds to the physical characteristic(s) sensed by one or more of the sensors 215. In other words, the output signal 305 represents the sensing information and/or processed sensing information processed by the sensor circuitry 220. As illustrated in FIG. 3, the waveform of the output signal 305 is during a working state (non-safe state) 310.

Figure 4:
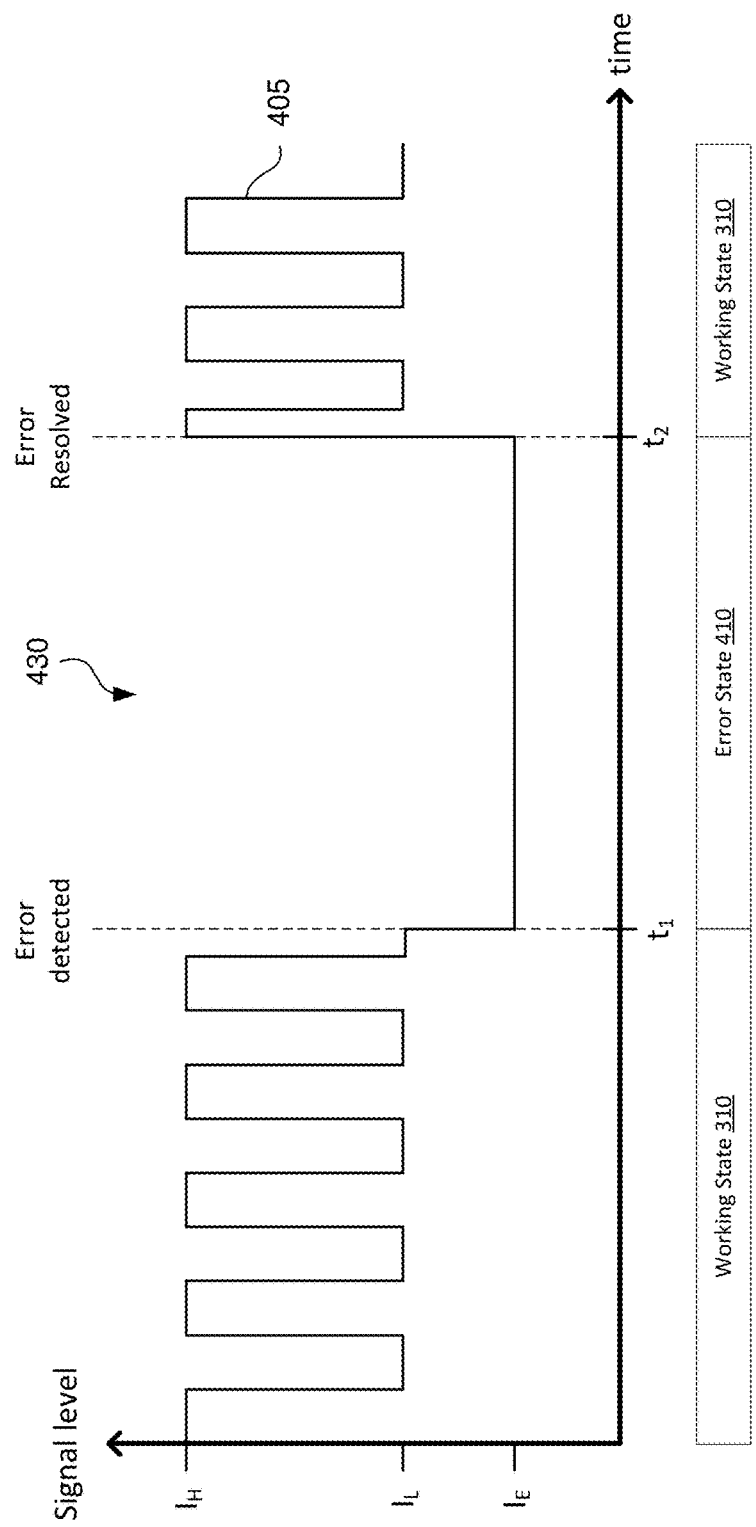
FIG. 4 illustrates a plot of a sensor output according to an exemplary embodiment of the present disclosure.

Turning to FIG. 4, the output signal 405 of the sensor system 205 according to an exemplary embodiment is illustrated. The output signal 405 is similar to the output signal 305, but illustrates the output signal 405 according to an exemplary embodiment where the sensor system 205 suffers one or more internal faults or errors. For example, the output signal 405 includes a portion where the sensor system 205 is operating in a working state 310 (non-safe state) followed by a portion 430 where the sensor system 205 is operating in an error state (safe state) 410, which is then followed by another working state 310 when the error is resolved. In particular, at time $t_1$, an error is detected by the sensor system 205 (e.g. fault detector 240), and the error is resolved at time t2. The portion 430, between $t_1$ and t2 corresponds to when the sensor system 205 is operating in a safe/error state 410. As shown in FIG. 4, the output signal 405 is adjusted from the sensing signal level ($I_H$, $I_L$) to an error signal level ($I_E$). The error signal level can correspond to a current level of, for example, 3 mA, but is not limited thereto. That is, during a safe state 410 (portion 430), the sensor circuitry 220 can be figured to adjust the signal level from the sensing signal level to the error signal level to indicate that the sensor system 205 or one of its components has suffered an internal fault or error.

Figure 5:
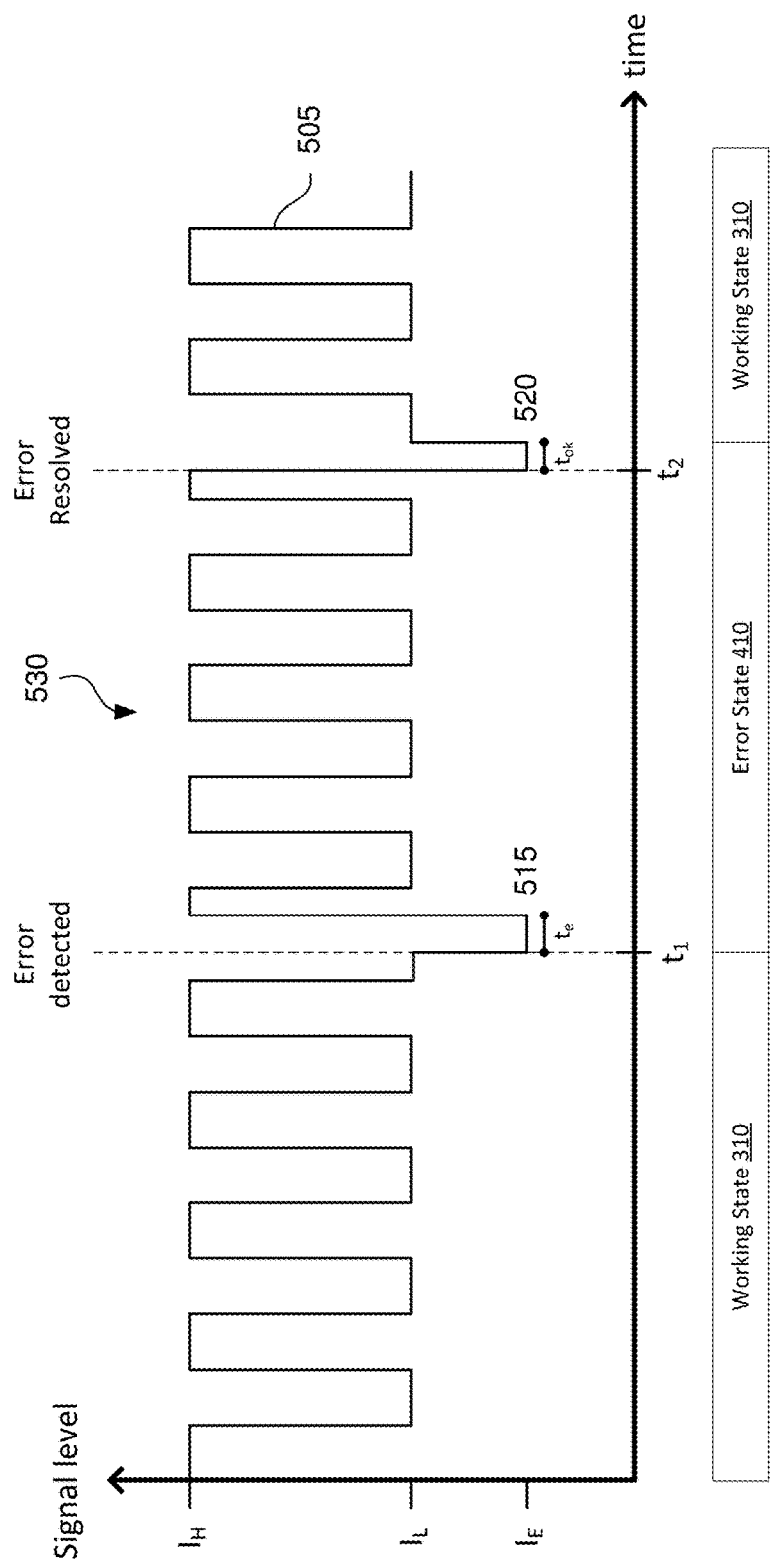
FIG. 5 illustrates a plot of a sensor output according to an exemplary embodiment of the present disclosure.

FIG. 5 illustrates an output signal 505 of the sensor system 205 according to an exemplary embodiment of the present disclosure. The output signal 505 is similar to the output signal 505, but instead of maintaining the output signal at the error signal level ($I_E$) until the error is resolved at time t2 as in FIG. 4, the sensor circuitry 220 is configured to generate an error indication signal pulse 515. The error indication signal pulse 515 can be generated in response to an error been detected by the fault detector 240 at $t_1$. In an exemplary embodiment, the error indication signal pulse 515 has a pulse width $t_e$.

In operation, the sensor circuitry 220 can be configured to adjust the signal level from the sensing signal level ($I_H$, $I_L$) to the error signal level ($I_E$) and generate the error indication signal pulse 515 having a determine pulse width $t_e$ to indicate that the sensor system 205 or one of its components (e.g. sensor(s) 215) has suffered an internal fault or error. Following the error indication signal pulse 515, the sensor circuitry 220 can be configured to adjust the signal level of the output signal 505 to return to the sensing signal level during a portion 530 of the output signal 505. In this example, the sensor circuitry 220 advantageously continues to generate the output signal 505 corresponding to the sensed physical characteristic during an error state (safe state) 410, while only momentarily adjusting the output signal 505 to indicate that one or more internal faults or errors have been detected by generating the error indication signal pulse 515 at $t_1$.

Upon resolution of the detected error at time t2, the sensor circuitry 220 can be configured to generate an error resolution signal pulse 520 to indicate that the detected error has been resolved or otherwise mitigated. The error resolution signal pulse 520 can have a pulse width of pulse width $t_{ok}$. In an exemplary embodiment, the pulse width $t_{ok}$ of the error resolution signal pulse 520 is different from the pulse width $t_e$ of the error indication signal pulse 515. Given the difference in pulse widths, the controller 110 or other device can differentiate between an error indication signal pulse 515 and an error resolution signal pulse 520. However, in one or more embodiments, the pulse width of the error indication signal pulse 515 and error resolution signal pulse 520 can be equal. Following the error resolution signal pulse 520, the sensor circuitry 220 can be configured to adjust the signal level of the output signal 505 to again return to the sensing signal level to continue to provide an output signal corresponding to the sensed physical characteristic. In this example, the sensor system 205 can advantageously provide the output signal 505 corresponding to the sensed physical characteristic during a safe state 410 and after an error has been detected while only momentarily adjusting the output signal 505 to generate the error indication signal pulse 515 and the error resolution signal pulse 520. That is, during the portion 530 of the output signal 505 (i.e., during an error/safe state 410), the sensor circuitry 220 can continue to provide the output signal corresponding to the sensed physical characteristic even after an error has been detected rather than, for example, maintaining the output signal at the error signal level amplitude as shown in FIG. 4.

In an exemplary embodiment, the error indication signal pulse 515 and/or the error resolution signal pulse 520 can have a predetermined pulse width. For example, for each error indication signal pulse 515, the sensor circuitry 220 can generate the error indication signal pulse 515 with a same pulse width. Similarly, the sensor circuitry 220 can be configured to generate the error resolution signal pulse 520 with a same pulse width for each of the error resolution signal pulses 520.

Figure 6:
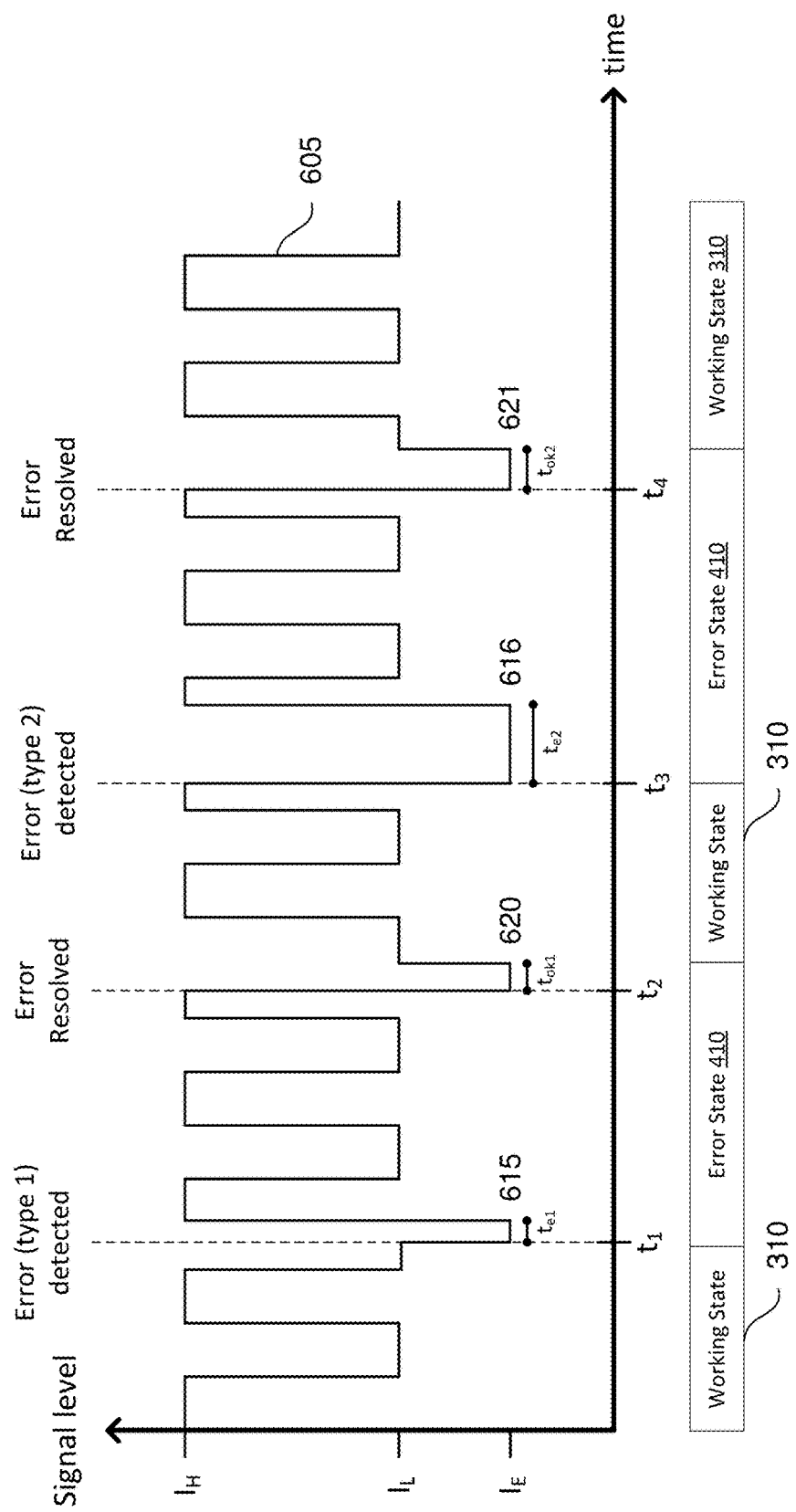
FIG. 6 illustrates a plot of a sensor output according to an exemplary embodiment of the present disclosure.

However, the pulse widths of the error indication signal pulses 515 and/or the pulse widths of the error resolution signal pulses 520 can be variable and depend, for example, on one or more parameters of the sensor system 205, one or more determinations made by the sensor system 205, or one or more other parameters as would be understood by one of ordinary skill in the relevant arts. Turning to FIG. 6, the output signal 605 includes two error indication signal pulses 615 and 616, which have corresponding error resolution signal pulses 620 and 621, respectively. In this example, the pulse width of the error indication signal pulse 615 is different from the pulse width of the error indication signal pulse 616. Similarly, the pulse width of the error resolution signal pulse 620 is different from the pulse width of the error resolution signal pulse 621. Further, the error indication signal pulses 615, 616 have different widths that their corresponding error resolution signal pulses 620, 621.

In an exemplary embodiment, the sensor circuitry 220 can be configured to adjust a pulse width of the error indication signal pulses 615, 616 and/or a pulse width of the error resolution signal pulses 620, 621. For example, the sensor circuitry 220 can be configured to adjust a pulse width of the error indication signal pulse 615, 616 based on a determined type of error that has been detected by the fault detector 240. That is, the pulse width $t_{e1}$, $t_{e2}$ of the error indication signal pulses 615, 616 can indicate the type of error that has been detected. For example, the error indication signal pulse 615 having a pulse width of $t_{e1}$ can indicate the detected error is of a first error type and error indication signal pulse 616 having a pulse width of $t_{e2}$ can indicate the detected error is of a second error type different from the first error type.

Similarly, the sensor circuitry 220 can be configured to adjust a pulse width of the error resolution signal pulse 620, 621 based on a determined/identified cause of the detected error, and/or the degree at which the detected error has been resolved. For example, the error resolution signal pulse 620 having a pulse width $t_{ok1}$ can indicate a first cause of the detected error associated with the error indication signal pulse 615 and the error resolution signal pulse 621 having a pulse width of $t_{ok2}$ can indicate a second cause of the detected error associated with the error indication signal pulse 616, where the second cause is different from the first cause. Additionally or alternatively, the different pulse widths of the error resolution signal pulses 620, 621 can correspond to the degree at which the associated errors have been resolved. In an exemplary embodiment, a larger pulse width for the error resolution signal pulse 620, 621 can represent that the associated error has been more completely resolved. For example, the larger pulse width $t_{ok2}$ can indicate that the error associated with the error indication signal pulse 616 was completely resolved while the shorter pulse width $t_{ok1}$ can indicate that the error associated with the error indication signal pulse 615 was only partially resolved.

Figure 7:
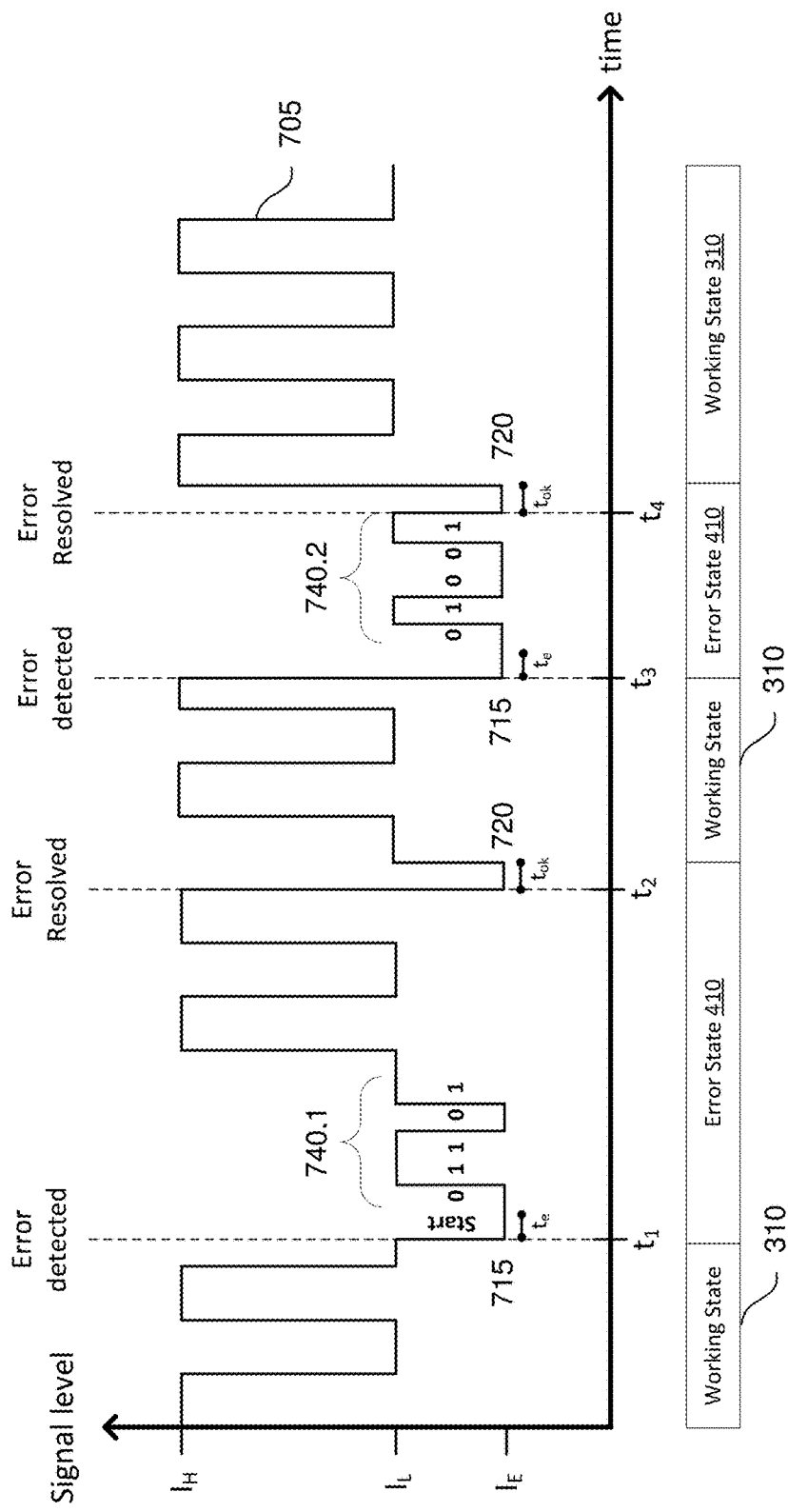
FIG. 7 illustrates a plot of a sensor output according to an exemplary embodiment of the present disclosure.

FIG. 7 illustrates an output signal 705 according to an exemplary embodiment of the present disclosure. Output signal 705 is similar to output signals 605 and 505, but includes a serial bit stream 740 that has been encoded in the output signal 705. In an exemplary embodiment, the sensor circuitry 220 can be configured to adjust the signal level (amplitude) of the output signal to transition between the error signal level ($I_E$) and the lower bound signal level ($I_L$) of the sensing signal level to generate a serial bit stream 740. For example, following the error indication signal pulse 715, the sensor circuitry 220 can adjust the output signal 705 to encode a bit stream 740.1 of, for example, 01101. Similarly, following the error indication signal pulse 715, a bit stream 740.2 having a value of 01001 can be encoded in the output signal 705. In this embodiment, the sensor circuitry 220 can be configured to provide additional information in the output signal 705 by encoding additional information in the encoded bit streams 740. In an exemplary embodiment, the output signal 705 represents, for example, a rotational speed, and the encoded bit streams 740 can represent, for example, a sensed temperature and/or other characteristic(s) as would be understood by one of ordinary skill in the relevant arts. In this example, although the encoded bit streams 740 are represented by alternating the signal level (amplitude) of the output signal between the error signal level ($I_E$) and the lower bound signal level ($I_L$) of the sensing signal level, other embodiments can include adjusting the signal level between, for example, the error signal level ($I_E$) and the higher bound signal level ($I_H$). In embodiments where an encoded bit stream is provided, the sensor system 205 can be configured to advantageously provide additional information during the error (safe) state followed an output signal 705 corresponding to the sensed physical characteristic.

Figure 8:
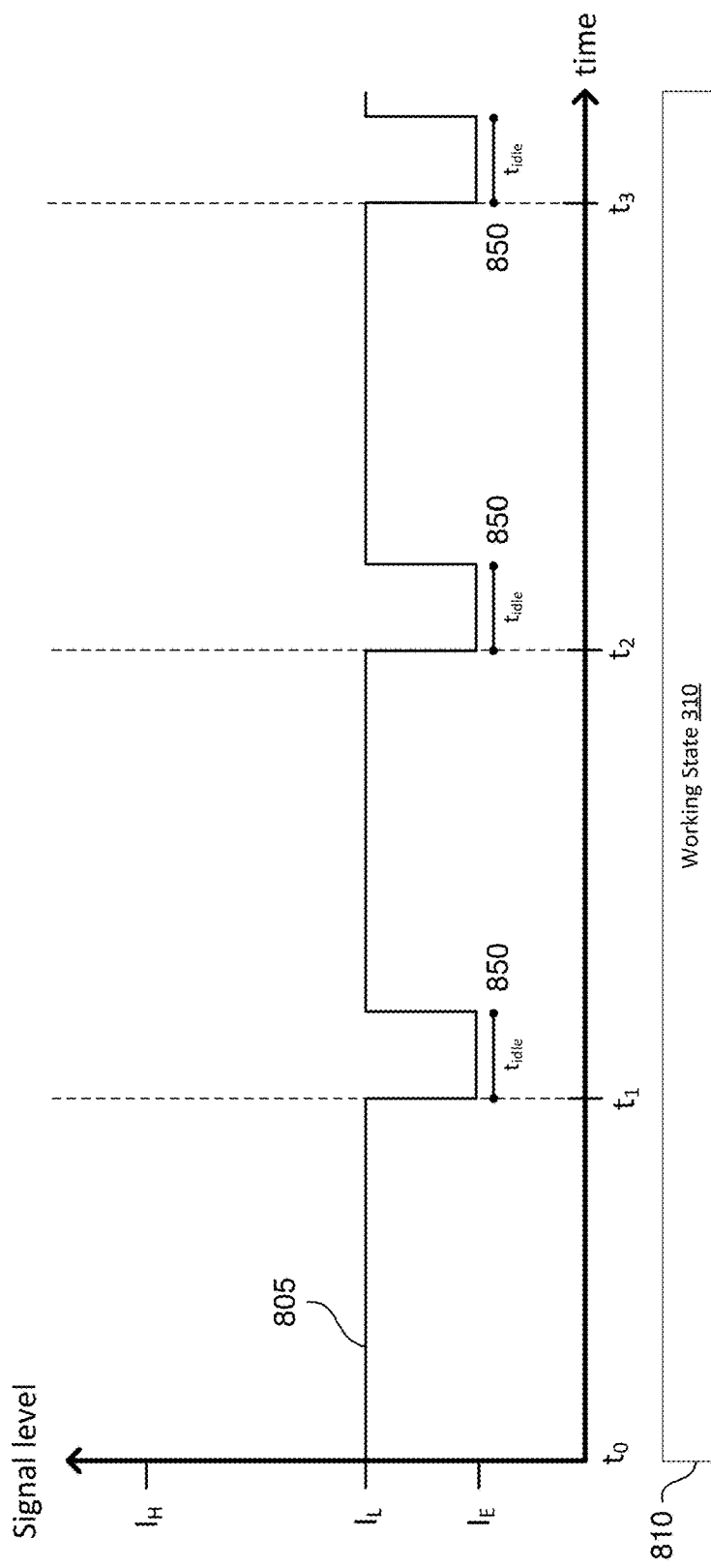
FIG. 8 illustrates a plot of a sensor output according to an exemplary embodiment of the present disclosure.

FIG. 8 illustrates an output signal 805 according to an exemplary embodiment of the present disclosure. The output signal 805 corresponds to an output signal of the sensor system 205 during an idle state (e.g., when the sensors 215 do not sense the physical characteristic). This is represented by the time period from time $t_0$ to time $t_1$ where the output signal 805 remains at the signal level $I_L$. In an exemplary embodiment, the sensor circuitry 220 can be configured to adjust the output signal 805 to transition to the error signal level $I_E$ and generate an idle signal pulse 850 having a pulse width of $t_{idle}$. In this example, the idle signal pulse 850 can be used to indicate that the sensor system 205 is operating properly but that no physical characteristic is being currently sensed by the sensors 215. That is, the idle signal pulses 850 can be used to confirm to the controller 110 that the sensor system 205 is operating properly, and/or that the communication path 107 between the sensor system 205 and the controller 110 has not been compromised. Although FIG. 8 illustrates that the idle signal pulse 850 have a same pulse width $t_{idle}$, the pulse widths of the error signal pulses 850 can be different. For example, the pulse width of the idle signal pulse 850 can be adjusted by the sensor circuitry 222 convey information within the idle signal pulses 850 similar to the varying pulse widths of the error indication signal pulses and the error resolution signal pulses. Additionally or alternatively, the sensor circuitry 220 can be configured to encode a bit stream within the idle signal pulses 850 similar to the embodiments illustrated in FIG. 7. That is, as one of ordinary skill would understand, the teachings of the various embodiments illustrated herein can be combined. For example, the output signal can include error indication signal pulses having varying or static pulse widths and error resolution signal pulses having varying or static pulse widths, while also encoding a bit stream within the output signal.

Figure 9:
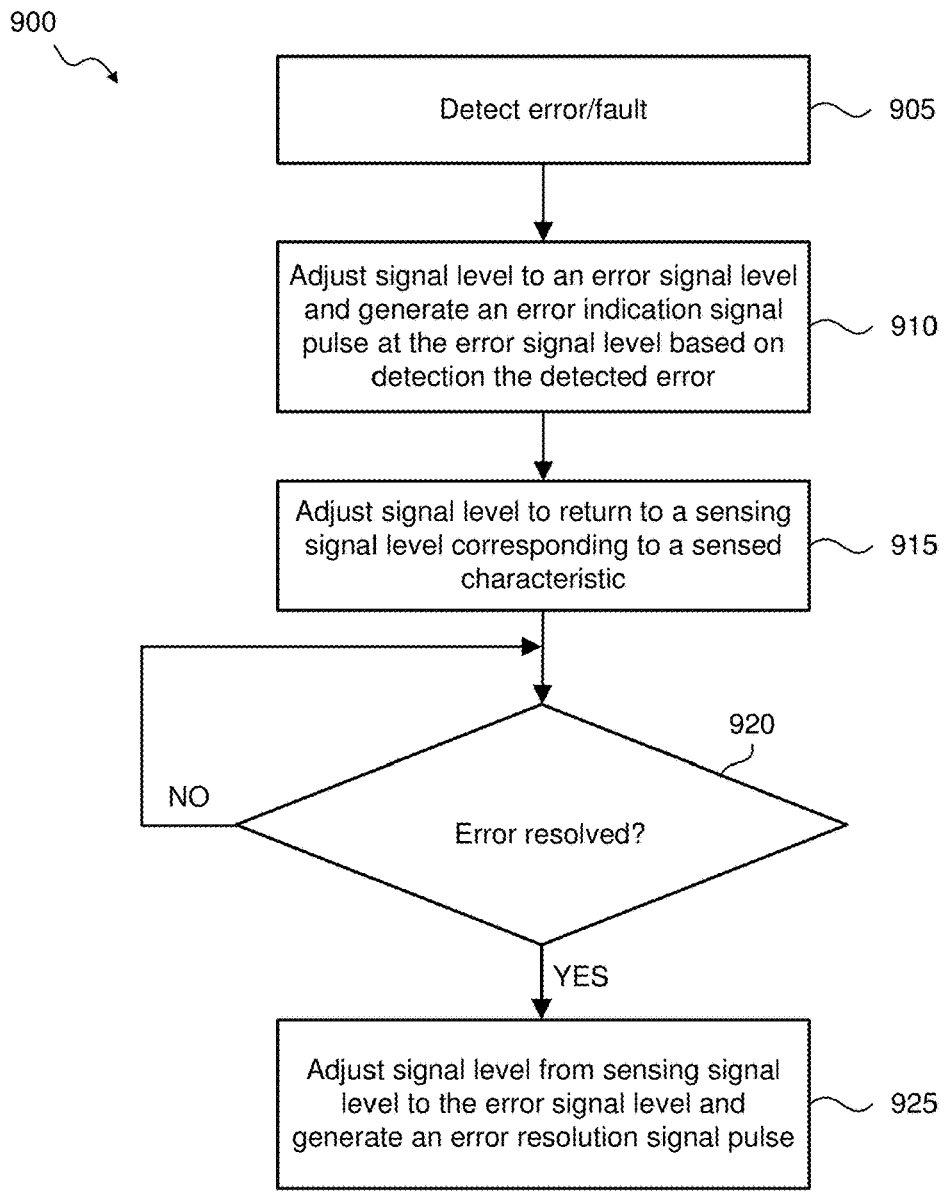
FIG. 9 illustrates a flowchart of a sensing method according to an exemplary embodiment of the present disclosure.

Turing to FIG. 9, a flowchart of an error detection and signaling method 900 according to an exemplary embodiment of the present disclosure is illustrated.

The flowchart is described with continued reference to FIGS. 1-8. The operations of the method are not limited to the order described below, and the various operations may be performed in a different order. Further, two or more operations of the method may be performed simultaneously with each other.

The method 900 begins at operation 905, where an error or internal fault is detected. In exemplary embodiment, the fault detector 240 can be configured to detect an error or internal fault of the sensor system 205 (e.g. of the sensor(s) 215).

After operation 905, the flowchart 900 transitions to operation 910, where a signal level of the output signal is adjusted (from a sensing signal level) to an error signal level and an error indication signal pulse is generated at the error signal level. In an exemplary embodiment, the adjustment and generation operations are performed in response to an error or internal fault being detected. In an exemplary embodiment, the sensor circuitry 220 can be configured to adjust the signal level of the output signal, and generate the error indication signal pulse.

After operation 910, the flowchart 900 transitions to operation 915, where, after the error indication signal pulse, the signal level of the output signal is adjusted to return the output signal to the sensing signal level corresponding to the sensed characteristic that is sensed by, for example, one or more sensors. In an exemplary embodiment, the sensor circuitry 220 can be configured to adjust the signal level of the output signal to return to the sensing signal level and to continue to generate the output signal corresponding to the sensed physical characteristic.

After operation 915, the flowchart 900 transitions to operation 920, where it is determined if the detected error has been resolved. If the error has not been resolved (NO at operation 920), the flowchart returns to operation 920. Otherwise, if the error has been resolved (YES at operation 920), the flowchart 900 transitions to operation 925. The sensor circuitry 220 and/or the fault detector 240 can be configured to determine if the detected error has been resolved.

At operation 925, the signal level is adjusted from the sensing signal level to the error signal level and an error resolution signal pulse is generated to indicate that the error has been resolved. In an exemplary embodiment, the sensor circuitry 220 can be configured to adjust the signal level of the output signal from the sensing signal level to the error signal level and to generate an error resolution signal pulse at the error signal level to indicate that the error has been resolved. After the error resolution signal pulse, the signal level can be adjusted to return (from the error signal level) to the sensing signal level to represent the sensed physical characteristic.

After operation 925, the flowchart 900 can and or can be repeated and returned to operation 905 if another error or internal fault is detected.

CONCLUSION

The aforementioned description of the specific embodiments will so fully reveal the general nature of the disclosure that others can, by applying knowledge within the skill of the art, readily modify and/or adapt for various applications such specific embodiments, without undue experimentation, and without departing from the general concept of the present disclosure. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

References in the specification to "one embodiment," "an embodiment," "an exemplary embodiment," etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The exemplary embodiments described herein are provided for illustrative purposes, and are not limiting. Other exemplary embodiments are possible, and modifications may be made to the exemplary embodiments. Therefore, the specification is not meant to limit the disclosure. Rather, the scope of the disclosure is defined only in accordance with the following claims and their equivalents.

Embodiments may be implemented in hardware (e.g., circuits), firmware, software, or any combination thereof. Embodiments may also be implemented as instructions stored on a machine-readable medium, which may be read and executed by one or more processors. A machine-readable medium may include any mechanism for storing or transmitting information in a form readable by a machine (e.g., a computing device). For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, digital signals, etc.), and others. Further, firmware, software, routines, instructions may be described herein as performing certain actions. However, it should be appreciated that such descriptions are merely for convenience and that such actions in fact results from computing devices, processors, controllers, or other devices executing the firmware, software, routines, instructions, etc. Further, any of the implementation variations may be carried out by a general purpose computer.

For the purposes of this discussion, the term "processor circuitry" shall be understood to be circuit(s), processor(s), logic, or a combination thereof. For example, a circuit can include an analog circuit, a digital circuit, state machine logic, other structural electronic hardware, or a combination thereof. A processor can include a microprocessor, a digital signal processor (DSP), or other hardware processor. The processor can be "hard-coded" with instructions to perform corresponding function(s) according to embodiments described herein. Alternatively, the processor can access an internal and/or external memory to retrieve instructions stored in the memory, which when executed by the processor, perform the corresponding function(s) associated with the processor, and/or one or more functions and/or operations related to the operation of a component having the processor included therein.

In one or more of the exemplary embodiments described herein, processor circuitry can include memory that stores data and/or instructions. The memory can be any well-known volatile and/or non-volatile memory, including, for example, read-only memory (ROM), random access memory (RAM), flash memory, a magnetic storage media, an optical disc, erasable programmable read only memory (EPROM), and programmable read only memory (PROM). The memory can be non-removable, removable, or a combination of both.

What is claimed is:

1. An error detection and signaling method for a sensor system, comprising:
   sensing, by a sensor of the sensor system, a physical characteristic and generating an output signal corresponding to the sensed physical characteristic;
   detecting an error associated with the sensor;
   adjusting a signal level of the output signal to an error signal level and generating an error indication signal pulse based on the detection of the error by the fault detector;
   adjusting the signal level at the error signal level to a sensing signal level corresponding to the sensed physical characteristic based on the error indication signal pulse to output the output signal corresponding to the sensed physical characteristic; and
   adjusting the signal level at the sensing signal level to the error signal level and generating an error resolution signal pulse in response to a resolution of the detected error to indicate the resolution of the detected error.

2. The method of claim 1, wherein the error indication signal pulse and the error resolution signal pulse have first and second pulse widths, respectively.

3. The method of claim 2, wherein the first and the second pulse widths are different.

4. The method of claim 2, wherein the first and the second pulse widths are equal.

5. The method of claim 2, further comprising:
   determining an error type of the detected error; and
   determining the first pulse width based on the determined error type, the determined first pulse width being indicative of the determined error type.

6. The method of claim 2, further comprising:
   determining a cause of the detected error; and
   determining the second pulse width based on the determined cause of the detected error, the determined second pulse width being indicative of the determined cause.

7. The method of claim 1, wherein the sensing signal level comprises a first signal level and a second signal level less than the first signal level.

8. The method of claim 1, further comprising:
   adjusting a pulse width of the output signal at the sensing signal level based on a property of the sensed physical characteristic, the adjusted pulse with being indicative of the property.

9. The method of claim 1, further comprising:
   adjusting the signal level between the error signal level and the sensing signal level to encode a serial bit stream in the output signal.

10. The method of claim 1, wherein sensor is a magnetoresistive sensor and the physical characteristic is a speed and/or direction of a rotating object sensed by the magnetoresistive sensor.

11. The method of claim 1, further comprising:
    generating an idle signal pulse at the error signal level in absence of the sensed physical characteristic and a detected error.

12. A sensor system, comprising:
    a sensor configured to sense a physical characteristic and generate an output signal corresponding to the sensed physical characteristic;
    a fault detector configured to detect an error associated with the sensor; and
    sensor circuitry configured to:
       adjust a signal level of the output signal to an error signal level and generate an error indication signal pulse based on the detection of the error by the fault detector;
       adjust the signal level at the error signal level to a sensing signal level corresponding to the sensed physical characteristic based on the error indication signal pulse to output the output signal corresponding to the sensed physical characteristic; and
       adjust the signal level at the sensing signal level to the error signal level and generate an error resolution signal pulse in response to a resolution of the detected error to indicate the resolution of the detected error.

13. The sensor system of claim 12, wherein the error indication signal pulse and the error resolution signal pulse have first and second pulse widths, respectively.

14. The sensor system of claim 13, wherein the first and the second pulse widths are different.

15. The sensor system of claim 13, wherein the first and the second pulse widths are equal.

16. The sensor system of claim 13, wherein:
the fault detector is further configured to determine an error type of the detected error; and
the sensor circuitry is further configured to determine the first pulse width based on the determined error type, the determined first pulse width being indicative of the determined error type.

17. The sensor system of claim 13, wherein:
the fault detector is further configured to determine a cause of the detected error; and
the sensor circuitry is further configured to determine the second pulse width based on the determined cause of the detected error, the determined second pulse width being indicative of the determined cause.

18. The sensor system of claim 12, wherein the sensor circuitry is further configured to adjust a pulse width of the output signal at the sensing signal level based on a property of the sensed physical characteristic, the adjusted pulse with being indicative of the property.

19. The sensor system of claim 12, wherein the sensor circuitry is further configured to:
adjust the signal level between the error signal level and the sensing signal level to encode a serial bit stream in the output signal.

20. The sensor system of claim 12, wherein the sensor is further configured to generate an idle signal pulse at the error signal level in absence of the sensed physical characteristic and a detected error.

\* \* \* \* \*